United States Patent [19]
Brown et al.

[11] Patent Number: 5,792,594
[45] Date of Patent: Aug. 11, 1998

[54] METALLIZATION AND TERMINATION PROCESS FOR AN INTEGRATED CIRCUIT CHIP

[75] Inventors: Vernon L. Brown, Barrington; Yaroslaw A. Magera, Algonquin, both of Ill.

[73] Assignee: Motorola, Inc., Schaumburg, Ill.

[21] Appl. No.: 625,157

[22] Filed: Apr. 1, 1996

[51] Int. Cl.⁶ .................................................. G03F 7/00
[52] U.S. Cl. ........................... 430/315; 430/313; 430/394; 427/98
[58] Field of Search .................................. 430/311, 313, 430/315, 324, 394; 427/58, 96, 98

[56] References Cited

U.S. PATENT DOCUMENTS

| | | | |
|---|---|---|---|
| 4,902,610 | 2/1990 | Shipley | 430/312 |
| 5,162,144 | 11/1992 | Brown et al. | 428/209 |
| 5,246,817 | 9/1993 | Shipley, Jr. | 430/312 |
| 5,260,170 | 11/1993 | Brown | 430/315 |
| 5,338,567 | 8/1994 | Kohm | 427/98 |

OTHER PUBLICATIONS

Metal Finishing, vol. 94, No. 1A (1996).
Aschenbrenner et al., "Electroless Nickel/Copper Plating as a New Bump Metallization," Proceedings of the 1994 International Conference on Multi–Chip Modules, pp. 390–395.
Pai et al., "Copper as the Future Interconnection Material," IEEE, VLSI Multilevel Interconnection Conference (Jun. 12–13, 1989), pp. 258–264.
Simon et al., "Electroless Deposition of Bumps for TAB Technology," Proceedings of the 40th ECTC Conference, Las Vegas (1990), pp. 412–417.
Pai et al., "Selectively Deposited Nickel Film for Via Filling," IEEE Electron Device Letters, vol. 10, No. 6 (Jun. 1989), pp. 257–259.

*Primary Examiner*—Kathleen Duda
*Attorney, Agent, or Firm*—Douglas D. Fekete; John B. McIntyre

[57] ABSTRACT

A process for metallizing an integrated circuit chip to form an interconnecting pattern for the chip's input/output terminals, wherein the process can be performed while the chip is still a part of the wafer on which it is fabricated and before separation into individual chips. The invention uses photodefinable resins as masks that form permanent dielectric layers of a multilayer structure with which interconnecting paths and terminals are defined on the surface of the chip. The process further employs conversion techniques that enable the interconnecting paths to be formed from metals other than aluminum, such that the electrical performance of the chip is enhanced. The use of the photodefinable resins renders the process of this invention conducive to inline processing techniques, thereby reducing processing costs while promoting high throughput and short cycle times. The process of this invention also enables the interconnecting paths to be readily customized for adaption to changing configuration requirements at the next assembly level, while also promoting greater dimensional precision of bumps formed at the terminals.

19 Claims, 2 Drawing Sheets

METALLIZATION AND TERMINATION PROCESS FOR AN INTEGRATED CIRCUIT CHIP

FIELD OF THE INVENTION

The present invention generally relates to integrated circuit chips and their fabrication. More particularly, this invention relates to a method for forming and redistributing the input/output terminals of an integrated circuit chip with the use of a catalyzed photodefinable resin as a permanent dielectric.

BACKGROUND OF THE INVENTION

Flip chips are monolithic semiconductor devices, such as integrated circuits, having bead-like or pill-like input/output terminals formed on one surface of the chip. The terminals, commonly referred to as bumps, serve to both secure and electrically interconnect the flip chip to a conductor pattern provided with the next assembly level, which is typically a circuit board such as a ceramic substrate, printed wiring board, flexible circuit, or a silicon substrate. The formation of bumps on a flip chip generally entails forming an aluminum pattern of interconnecting paths on the surface of a spun-on polymer layer, such as polyimide. The process typically includes a series of evaporation processes with masks, in combination with etching, for photodefinition of the polymer layer. Openings (vias) etched in the polymer layer provide for selective connection between the pattern's interconnecting paths and aluminum pads provided by the underlying circuitry.

The above process is generally referred to as "redistribution" since the interconnecting paths enable the bumps on the chip to be displaced laterally from their corresponding circuitry pads, such that a terminal pattern can be formed on the flip chip that will appropriately register with the conductor pattern of the next assembly level, e.g., a circuit board. Other than the selective connection required between the interconnecting paths and their corresponding aluminum pads, the aluminum pattern is electrically insulated from the active regions of the underlying integrated circuit with the polymer layer.

To form the flip chip bumps, aluminum pads are then formed at the end, or termination, of each interconnecting path, after which an additional dielectric layer is deposited and patterned to expose the pads but otherwise form a permanent insulating layer over the aluminum pattern. A series of metal evaporations through metal masks deposits a conductive material, such as a tin/lead solder alloy, on the surfaces of the aluminum pads. A significant volume of material is typically deposited, on the order of about 125 micrometers in diameter and about 80 micrometers in thickness. During this process, the metal masks are necessary to confine the metal depositions to the aluminum pads. The metal depositions are then typically reflowed to produce solderable bumps by heating the metal above its liquidus temperature, such that the molten metal coalesces to form quasi-hemispherical bumps on the surfaces of the pads. Inherently, the volume of each bump is controlled by the process and the mask geometry. After solidifying, the chip is placed on the circuit board such that its bumps register with their corresponding solderable terminals, and the bumps and terminals are reheated above the liquidus temperature of either the bumps or terminals in order to bond the chip to the solderable terminals. Alternatively, terminal bumps on a flip chip can be formed by a metal composition that is not reflowed during attachment. For this approach, precision electroplating can be used with appropriate plating buses and masks to form bondable gold, nickel or tin-plated terminals that are typically raised and flat, but without redistribution on the wafer. This type of terminal can be soldered or joined ultrasonically or by compression to the pattern of the next assembly level. Yet another alternative is to form the flip chip bumps from a suitably conductive material, and then bond each of the bumps to the conductor pattern of the next assembly level with a conductive adhesive.

As can be appreciated from the above prior art processes, forming input/output terminal bumps on flip chips is rather complex and costly. In addition,- precise volume control of the bump is difficult due to the dimensional and registration tolerances associated with techniques and equipment used to deposit the bump material. In particular, precision of the metal structures is limited by the reliance on evaporation techniques and metal masks, the precision of the latter inherently degrading with use. The net effect is that the spacing between bumps must often be much larger than is otherwise necessary and desired, such that flip chips cannot be attached to many otherwise applicable integrated circuits having a pitch smaller than about 0.4 millimeters (about sixteen mils). Another disadvantage of imprecise volume control of the bump material is an increased likelihood of inadequate adhesion if insufficient material is deposited, or shorting between bumps if excessive material is deposited. Furthermore, reliance on the use of metal masks renders such methods relatively inflexible to changes required for the terminal bump pattern that become necessary in order to adapt to revisions at the next assembly level. Finally, masks and mask renewal and handling are very expensive.

Those skilled in the art will also appreciate that various subprocesses used with the above methods are batch in nature, using conventional semiconductor processing techniques and equipment. As such, another disadvantage of such methods is that high throughput and short cycle times achievable with inline processing methods are not possible. Furthermore, processing and material costs are relatively high because of the use of photoresists, etching steps, and polyimide as the polymer material. Finally, the performance of flip chips formed by these methods is limited by the use of aluminum as the conductor material for the interconnecting paths.

SUMMARY OF THE INVENTION

According to the present invention, there is provided a process for metallizing an integrated circuit chip, while still in a multi-chip wafer form, to produce a precision interconnecting pattern with a terminal bump pattern on the chip. The chip can essentially be any type of bumped microelectronic device, such as a flip chip. In particular, the invention entails an interconnection, redistribution and termination process by which interconnecting paths are defined on the surface of a chip to form terminations at which the chip's terminal bumps are formed. The process enables the interconnecting paths to be formed from metals other than aluminum, so as to enhance the performance of the chip. Furthermore, the process is conducive to the use of inline processing techniques, thereby reducing the costs while promoting high throughput and short cycle times. Finally, the process of this invention can be readily customized to adapt to changing configuration requirements as well as specific and different designs, yet produces bumps having greater dimensional precision than current processing methods.

The process generally entails the use of photodefinable resins as masks that form permanent dielectric layers of a multilayer structure in which interconnecting paths are formed on an integrated circuit chip having aluminum metallizations, including aluminum bond pads. The method includes depositing a first photodefinable resin containing a catalytic filler on the surface of the integrated circuit chip and over at least one of the pads so as to form a first dielectric layer. The dielectric layer is photoimaged and developed so as to expose at least a portion of the pad. A second photodefinable resin, formulated with or without the catalytic filler, is then deposited on the first dielectric layer and over the exposed portion of the pad so as to form a second dielectric layer of the structure. This dielectric layer is also photoimaged and developed so as to re-expose the pad and a surface portion of the first dielectric layer contiguous with the exposed portion of the pad. A catalytic metal that is less active than aluminum is then deposited on the exposed portion of the pad so as to form a catalytic metal layer on the pad. In this manner, the aluminum pad, which is not plateable but highly corrosive and poisonous to electroless copper plating processes, is overlaid with a metal that is protective and catalytic to electroless plating. The exposed surfaces of the first dielectric layer are then treated such that the catalytic filler causes the exposed surfaces to be plateable. A conductive material, preferably copper, is then electrolessly plated on the surfaces of the first dielectric layer and the catalytic metal layer to yield a conductor layer that is delineated by the photodefined patterns in the first and second dielectric layers. The conductor layer can be patterned in this matter to form a well-defined interconnecting path and termination for a bump that is electrically interconnected with the pad through the interconnecting path. In a preferred embodiment, the catalytic metal layer is formed on the pad by a series of steps that include metal conversion processes. Preferably, a first metal conversion process is conducted to form a zinc layer on the exposed portion of the aluminum pad. The presence of the zinc layer enables a nickel layer to be electrolessly deposited, which provides a film that is pinhole-free and a surface on which copper can be electrolessly plated. Alternatively, a second metal conversion process can be performed to form a palladium layer on the nickel layer, over which the copper conductor is deposited.

As described above, the present invention allows for the metallization of an integrated circuit chip through an interconnection, redistribution and termination process that yields interconnecting paths and terminations on which various types of terminal bumps may be formed. Several chip bump configurations and techniques are enabled by the process of this invention. One process option is to deposit a third photodefinable resin on the conductor layer and the second dielectric layer, and then photodefine the third photodefinable resin so as to form a third dielectric layer that exposes a limited portion of the conductor layer. Thereafter, the third dielectric layer can be used as a mask to deposit a solderable metal composition on the exposed portion of the conductor layer. Alternatively, a conductive adhesive could be deposited on the exposed portions of the conductor layer if the chip is to be registered with predefined bumps formed on the circuit board to which the chip is mounted. Yet another alternative is to form a conductive adhesive bump on the exposed portions of the conductor layer, and then appropriately register the chip with the bumps. Conductive adhesive can be deposited with or without use of the third photodefined layer.

A second option is to photoimage and develop the first dielectric layer such that a noncontiguous second portion of the first dielectric layer remains on a central portion of the pad. With this configuration and use of the second photodefinable resin, the treating and electroless plating steps cause copper to also be deposited on the noncontiguous second portion of the first dielectric layer, thus producing a copper pad that is raised above the plated level of the rest of the pad. A further variation of this option is to form a third dielectric layer containing a catalytic filler on the second portion of the first dielectric layer prior to the electroless plating step. In this manner, the treating step also causes the third dielectric layer to be plateable, such that the electroless plating step results in copper being deposited on both the second portion of the first dielectric layer and on the third dielectric layer. This latter technique can be employed to produce a conductor layer on the third dielectric layer that projects above the second dielectric layer, such that the conductor layer can serve as a nonremeltable bump.

From the above, those skilled in the art will appreciate that the method of this invention overcomes the shortcomings of the prior art, particularly due to the ability of the photodefinable resins to serve multiple roles within a multilayer structure. As a mask, the photodefinable resins define the interconnecting paths and determine the size of the bumps on the chip with sufficient precision to ensure that three-dimensional surfaces are available to produce optimally shaped and sized bumps. Those skilled in the art will also appreciate that the processing techniques described above are conducive to inline techniques, thus avoiding the batch processing required by the prior art and enabling higher throughput and shorter cycle times. Processing and material costs can also be reduced by the invention of this method while promoting the adaptability of the process to design changes at the next assembly level.

BRIEF DESCRIPTION OF THE DRAWINGS

The above and other advantages of this invention will become more apparent from the following description taken in conjunction with the accompanying drawings, in which.

DETAILED DESCRIPTION OF A PREFERRED EMBODIMENT

The processing steps of this invention are generally represented in FIGS. 1 through 4, which illustrate two embodiments by which the integrated circuitry of a flip chip can be metallized to achieve interconnection, redistribution and termination for the chip's input/output terminals. The process described and represented in the FIGS. serve to illustrate advantageous features of this invention in reference to making connection to the final metal layer of an integrated circuit flip chip, though it will be apparent to those skilled in the art that the invention is applicable to other bumped devices and to multilayered interconnections as well, for both integrated circuits and other devices.

Figure 1:
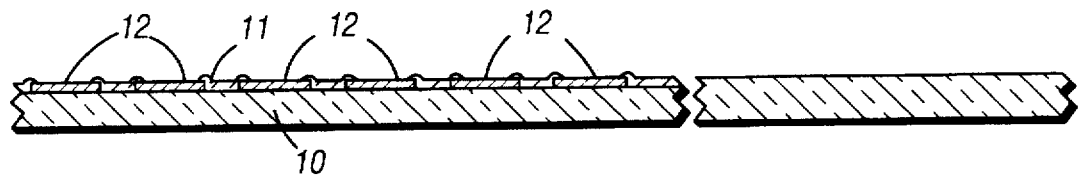
FIGS. 1 through 3 represent processing steps for metallizing a flip chip in accordance with a first embodiment of this invention.

Referring to FIG. 1, a substrate 10 is shown on which aluminum pads 12 have been previously formed by any suitable technique. In the context of this invention, the substrate 10 is a silicon wafer, though it is foreseeable that other suitable active substrates could be used. As shown, the pads 12 are aluminum features such as flip chip terminations or bond pads that are designed for wire bonding, but may be located anywhere in an integrated circuit (not shown) formed in or on the surface of the substrate 10. Shown overlying the surface of the substrate 10 and surrounding the pads 12 is a dielectric layer 11, typically a passivation layer such as silicon nitride, silicon dioxide or a glassified surface, that protects and electrically insulates the integrated circuitry on the substrate 10. The passivation layer is a conventional feature of wafer fabrication.

Figure 2A:
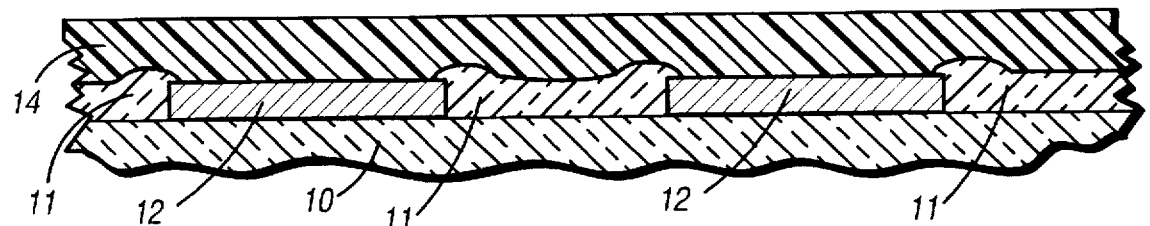
Figure 2B:
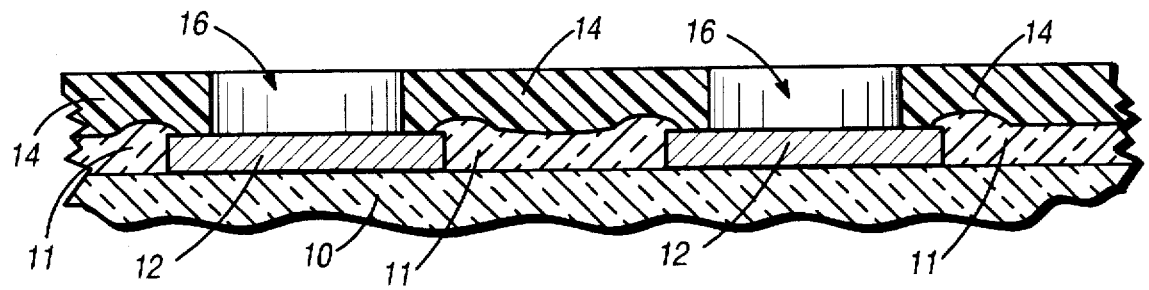

FIG. 2A illustrates the first step of the invention, in which a photodefinable resin layer 14 has been formed on the surface of the substrate 10, including each of the pads 12. According to this invention, the resin layer 14 is composed of a resin mixture containing a photosensitive material and a catalytic filler that, when the resin layer 14 is appropriately treated, yields a surface that is catalytic to electroless copper plating. The photosensitive material content of the resin mixture results in the resin layer 14 being photodefinable, such that photoimaging and development techniques can be employed to pattern openings 16 in the resin layer 14, as shown in FIG. 2B. The resin component of the resin mixture can be any suitable liquid resin or solid resin dissolved in a solvent, so as to enable the resin mixture to be readily deposited onto the surface of the substrate 10 to form the resin layer 14. Resins that could be used include thermoplastic resins, thermosetting resins, elastomers and mixtures thereof, which when incorporated with a photosensitive material yield a photodefinable resin mixture. Desirable properties for the resin mixture include dielectric and physical properties that remain stable throughout deposition and photoimaging of the resin layer 14.

According to this invention, a preferred composition for the resin layer 14 is a photodefinable resin disclosed in U.S. Pat. No. 5,162,144 to Brown et al. and U.S. Pat. No. 5,260,170 to Brown, each of which is commonly assigned with this invention and incorporated herein by reference. In accordance with the teachings of Brown et al. and Brown, a suitable resin component for the resin mixture is an epoxy, while suitable photosensitive materials include a family of compositions available from Ciba-Geigy, Inc., under the trademark PROBIMER 61. Suitable photosensitivity is attained with the PROBIMER 61 material from a photoinitiator present in amounts of up to about five percent of the total epoxide molecules that are cross-linked in the final, totally cured resin layer 14. Differing amounts of photoinitiator are recognized as being useful depending on the specific resin formulation and image development process used. The catalytic filler is preferably metal oxide particles that constitute less than about ten weight percent of the resin-oxide mixture. A preferred metal oxide is cuprous oxide, though other oxides or catalytic fillers could be used, including a catalytic material available from Johnson-Matthey of New Jersey, USA, under the trademark CAT-10.

The manner in which the resin mixture is deposited to form the resin layer 14 will depend to some degree on the particular resin component of the mixture. Due to the presence of the photosensitive material, the openings 16 in the resin layer 14 can be precisely photochemically defined through a mask (not shown) and developed in the resin layer 14 in a manner consistent with the resin. As shown in FIG. 2B, openings 16 are selectively sized to expose a portion of each pad 12 to which interconnection is desired, with the resin layer 14 overlying a peripheral portion of each pad 12. Alternatively, the openings 16 could be sized or shaped to expose any portion of the pads 12, as will become apparent with reference to the embodiment represented in FIG. 4.

Figure 2C:
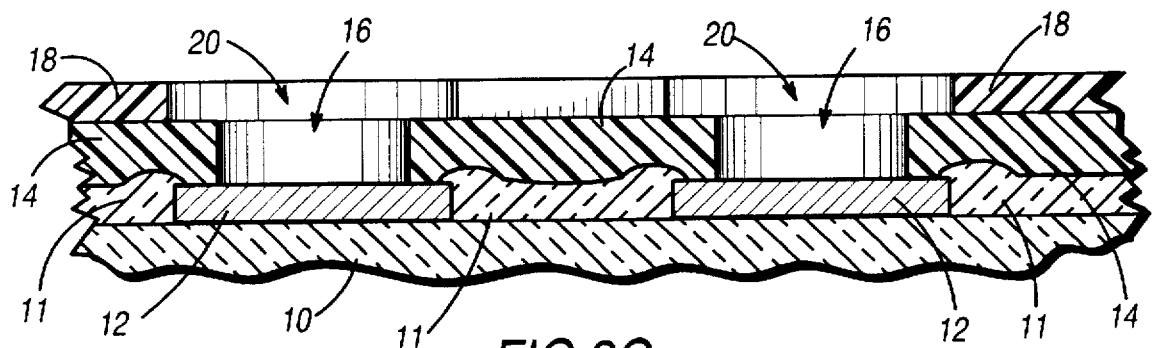

Following formation of the openings 16, a second resin layer 18 is applied and patterned to form an opening 20, as shown in FIG. 2C. The second resin layer 18 can have a similar or compatible composition to that of the first resin layer 14, though it contains no catalytic filler for the role served by the resin layer 18, which is primarily that of a permanent plating mask and dielectric layer. As shown in FIG. 2C, the opening 20 encompasses both of the openings 16 in the first resin layer 14, including the pads 12 and a portion of the first resin layer 14 surrounding the pads 12. After the second resin layer 18 is photochemically patterned, the first and second resin layers 14 and 18 are simultaneously and sufficiently cured to be resistant to chemical attack. Alternatively, the first resin layer 14 may be applied and photodefined but without image development. The second resin layer 18 may then be applied and photodefined, and the latent images of both resin layers 14 and 18 developed to yield the result shown in FIG. 2C.

Figure 2D:
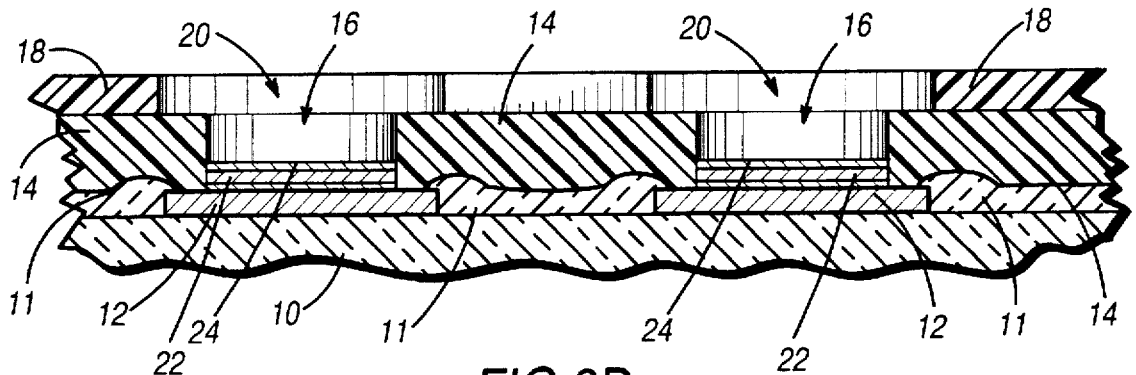

FIG. 2D shows the result of metal conversion processes in which the exposed aluminum pads 12, which cannot be electrolessly plated, is overlaid by a less active metal that is catalytic to electroless plating. A first conversion process, widely practiced in the art of aluminum plating and found suitable for purposes of this invention, is known as zincating. This process is detailed in Metal Finishing, Vol. 94, No. 1A (1996), and entails replacing aluminum with zinc at the surface of each pad 12 in an immersion or substitution process. Thereafter, the zinc layer can be used to initiate electroless nickel plating that continues autocatalytically in a nickel electroless bath, as reported by Aschenbrenner et al. in "Electroless Nickel/Copper Plating as a New Bump Metallization," reported at the Proceedings of the 1994 International Conference on Multi-Chip Modules. According to this invention, the resulting nickel layer 22 must be sufficiently thick, generally about five to ten micrometers, to be pore-free in order to protect their underlying aluminum pads 12 from attack by subsequent processing. A second conversion step can be undertaken to render the surface of the nickel layer 22 more catalytic by replacing the top atomic layer of nickel with palladium via replacement in a dilute palladium chloride solution, as disclosed in co-assigned U.S. patent application Ser. Nos. 08/330,473 and 08/567,860 to Richards et al.

Both the nickel layer 22 and the optional converted palladium film 24 are catalytic to an electroless copper bath, such that copper can be electrolessly deposited at a rate determined by the length of time which the nickel layer 22 or the converted palladium film 24 is exposed to the bath. However, prior to plating, the surface of the resin layer 14 is treated to also become catalytic to the electroless copper bath. For this purpose, the resin layer 14 is subjected to attack by a chemical such as permanganate or by reactive ion etching to expose metal oxide particles at and near the surface of the resin layer 14. A reducing agent including borohydride is then applied in a starved manner to convert the exposed metal oxide particles at the surface of the resin layer 14 to islands of catalytic film having a surface resistivity of greater than about $10^6$ ohms per square. According to Brown et al., by limiting the amount of metal oxide in the resin layer 14 to about ten weight percent or less, sufficient oxide is present to form a thin discontinuous catalytic film. This discontinuous film, composed of unconnected islands of catalytic film, assures that excessive and uncontrolled plating does not occur on the surface of the resin layer 14. Those skilled in the art will appreciate that, if the above steps of exposing and converting the particles is not performed, the resin layer 14 can be used to serve as a conventional solder mask that can be subjected to typical printed circuit manufacturing and service environments, including electroless plating, without effect or change.

In the reduction process used to convert cuprous oxide to a catalytic film at the surface of the first resin layer 14, the readily-oxidized nickel layers 22 overlying the pads 12 are also reduced to chemically active nickel, which will accept electroless copper. If the method of Richards et al. is used, a molecular layer of palladium is formed over the catalyzed surfaces of the first resin layer 14, in addition to the converted palladium film 24 that forms on the nickel layer 22. This optimal process normalizes differences in chemical activity between copper, nickel and the catalyzed resin, and provides a particularly advantageous preparation for subsequent electroless copper plating.

Figure 2E:
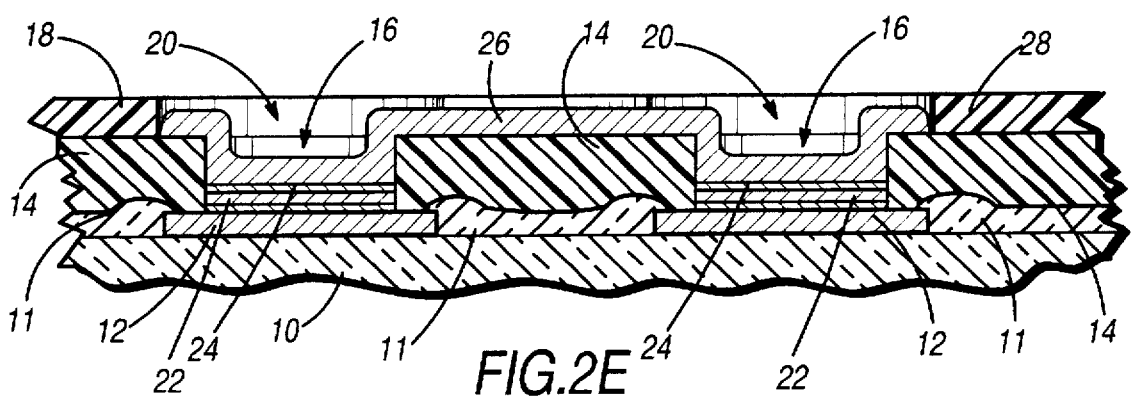

FIG. 2E represents the next step in the process of this invention, in which the catalytic surfaces of the resin layer 14 and either the nickel layer 22 or the converted palladium film 24 are electrolessly plated with copper for a time sufficient to produce an electroless copper layer 26. As is apparent from FIG. 2E, the second resin layer 18 serves as a mask, such that only those surfaces exposed by the opening 20 in the second resin layer 18 are plated during exposure to the electroless copper bath. The result is a well-defined copper interconnection between the pads 12. The interconnection (copper layer 26) can be used for redistribution of an input/output terminal of the chip. It is foreseeable that the copper layer 26 could be formed in the above manner to yield a relatively low cost replacement for the final layer interconnection for the chip's integrated circuit. Because the interconnection is copper and not evaporated thin aluminum, as was required by the prior art processes, improved electrical performance is achieved due to copper's higher electrical conductivity, as discussed by Pai et al. in "Copper as the Future Interconnection Material," IEEE, VLSI Multilevel Interconnection Conference (Jun. 12–13, 1989), pp. 258–264. Furthermore, because the copper layer 26 is defined by the photodefined resin layers 14 and 18, the resulting interconnection can be readily modified and customized by a photomask change to acquire a termination configuration required for a given application. As shown, the copper layer 26 could alternatively form two connecting points of an electrical shield (e.g., a ground plane) used to isolate integrated circuits from additional interconnection layers subsequently formed above the copper layer 26. Yet another possibility is that the copper layer 26 could be used to interconnect two or more integrated circuits on the same substrate 10.

Figure 3:
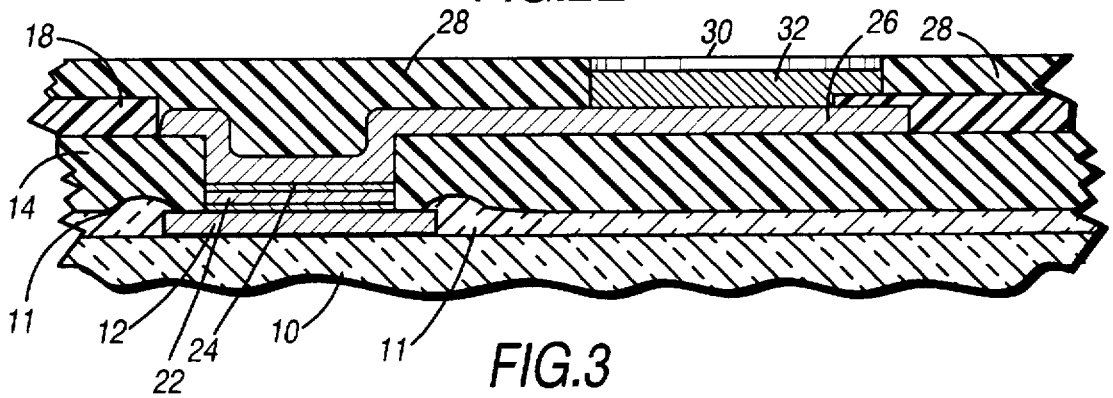

From the above, it can be appreciated that the process depicted in FIGS. 1 through 2E could be used to form all long distance interconnections on an integrated circuit chip, making possible low cost interconnection customization since the processes used are readily implemented in large-area continuous processes that are cost effective at low volume production. The result of additional processing steps is shown in FIG. 3, which illustrates the use of the copper layer 26 as a termination pad for a flip chip bump. These steps entail depositing a dielectric layer, most preferably a third photodefinable resin layer 28 having the same composition as either the first or second resin layer 14 or 18, over the second resin layer 18 and the copper layer 26, and then patterning the third resin layer 28 to form an opening 30 through which a portion of the copper layer 26 is exposed. The third resin layer 28 serves as a mask through which additional electroless copper, nickel or gold plating 32 can be performed if required to enhance bump soldering. The additional plating 32 may form a conductive pad as show in FIG. 3. A suitable solder composition (not shown) can then be deposited on the exposed portion of the copper layer 26 to form a solder bump for electrical connection to the next assembly level, such as a circuit board. Alternatively, a conductive adhesive could be deposited on the copper layer 26 to form an adhesively bondable terminal with a suitably prepared circuit board.

Figure 4:
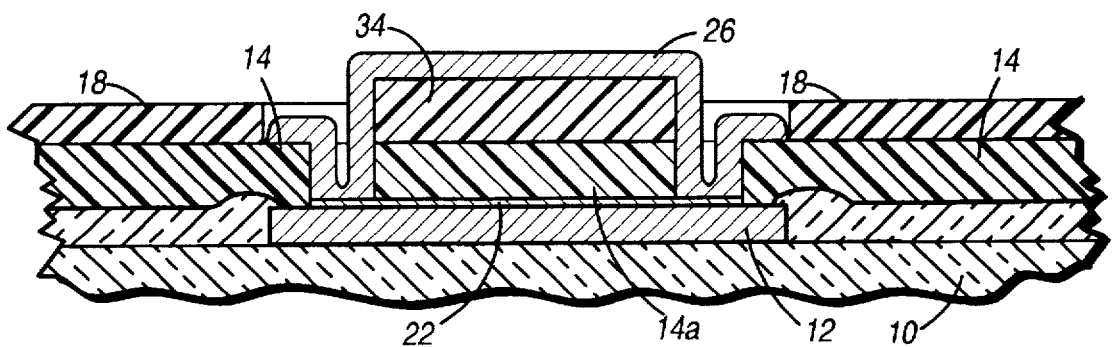
FIG. 4 represents a flip chip bump produced in accordance with an optional processing technique of this invention.

Finally, FIG. 4 illustrates an embodiment of this invention in which nearly identical processing can yield raised flip chip input/output terminals that are completed by a metal composition. With this approach, the processing steps of FIGS. 1 through 2C remain essentially the same, except that the first resin layer 14 is photochemically patterned such that a portion 14a of the layer 14 remains on a central region of one of the aluminum pads 12. As a result, an intermediate portion of the pad 12 remains exposed between the portion 14a and the remaining layer 14. An additional photodefinable resin containing the catalytic filler is then deposited and photodefined such that a third plateable resin layer 34 overlies the portion 14a of the first resin layer 14. Similar to FIG. 2D, the exposed portion of the pad 12 then undergoes the previously-described metal conversion process to yield an upper layer 22 of nickel that has a surface which is then or later made catalytic to electroless copper plating. The first and third resin layers 14 and 34 are treated as described previously to render their exposed surfaces catalytic to an electroless copper bath. While exposed to the bath, copper is deposited on the first resin layer 14, including the portion 14a, and the third resin layer 34 such that a continuous copper layer 26 is formed that is electrically interconnected with the pad 12.

As shown in FIG. 4, the above steps can be carried out such that the copper layer 26 deposited on the third resin layer 34 projects above the upper surface of the second resin layer 18 surrounding the pad 12. In this manner, the copper layer 26 can serve as a terminal that can be soldered or joined ultrasonically or by compression to a terminal pad of the next assembly level. Alternatively, the terminal formed by the copper layer 26 can be attached to a corresponding terminal pad with a conductive adhesive. It will be recognized by those skilled in the art that the terminal surface may be further converted to other metals to improve reliability.

While our invention has been described in terms of a preferred embodiment, it is apparent that other forms could be adopted by one skilled in the art. For example, certain processing parameters could be modified, appropriate materials could be substituted, or the process of this invention could be employed for different applications or other processes. In addition, it is within the scope of this invention that opposite surfaces of the same substrate could be processed as described above. Accordingly, the scope of our invention is to be limited only by the following claims.

The embodiments of this invention in which an exclusive property or privilege is claimed are defined as follows:

1. A method for metallizing an integrated circuit chip having aluminum metallization exposed at a surface thereof, the method comprising the steps of:

depositing a first photodefinable resin containing a catalytic filler on the surface of the integrated circuit chip and over the aluminum metallization so as to form a first dielectric layer;

photoimaging and developing the first dielectric layer so as to expose at least a portion of the aluminum metallization;

depositing a second photodefinable resin on the first dielectric layer and over the portion of the aluminum metallization so as to form a second dielectric layer;

photoimaging and developing the second dielectric layer so as to re-expose the portion of the aluminum metallization and to expose a surface portion of the first dielectric layer contiguous with the portion of the aluminum metallization;

depositing a catalytic metal on the portion of the aluminum metallization so as to form a catalytic metal layer thereon, the catalytic metal being less active than aluminum;

treating the surface portion of the first dielectric layer such that the catalytic filler causes the surface portion to be plateable; and electrolessly plating a conductive material on the surface portion of the first dielectric layer and the metal layer so as to form a conductor that is electrically interconnected with the aluminum metallization through the metal layer.

2. A method as recited in claim 1 wherein the catalytic filler comprises metal oxide particles distributed within the first photodefinable resin, and wherein the treating step entails the metal oxide particles at the surface portion of the first dielectric layer being converted to form unconnected islands of an electroless plating catalyst.

3. A method as recited in claim 1 wherein the step of photoimaging and developing the second dielectric layer results in the first dielectric layer covering a peripheral portion of the aluminum metallization.

4. A method as recited in claim 1 wherein the step of depositing the catalytic metal further comprises forming the catalytic metal layer on the aluminum metallization by a series of steps that include a metal conversion process.

5. A method as recited in claim 1 wherein the step of depositing the catalytic metal further comprises forming a zinc layer over the portion of the aluminum metallization through a metal conversion process.

6. A method as recited in claim 5 further comprising the step of electrolessly depositing a nickel layer on the zinc layer.

7. A method as recited in claim 6 further comprising the step of forming a palladium layer over the nickel layer.

8. A method as recited in claim 1 further comprising the steps of:

depositing a third photodefinable resin on the conductive material and the second dielectric layer; and photodefining the third photodefinable resin so as to form a third dielectric layer that exposes a portion of the conductive material.

9. A method as recited in claim 8 further comprising the step of using the third dielectric layer as a mask to deposit a metal on the conductive material.

10. A method as recited in claim 1 wherein the step of photoimaging and developing the first dielectric layer results in a second portion of the first dielectric layer remaining on the aluminum metallization, the second portion of the first dielectric layer being noncontiguous with the surface portion of the first dielectric layer.

11. A method as recited in claim 10 wherein the treating and electroless plating steps result in the conductive material also being deposited on the second portion of the first dielectric layer.

12. A method as recited in claim 10 further comprising the step of forming a third dielectric layer containing a catalytic filler on the second portion of the first dielectric layer prior to the electroless plating step, whereby the treating step causes the third dielectric layer to be plateable such that the electroless plating step causes the conductive material to be deposited on the second portion of the first dielectric layer and on the third dielectric layer.

13. A method as recited in claim 12 wherein the step of forming the third dielectric layer is conducted such that the conductive material deposited on the third dielectric layer projects from the surface of the integrated circuit chip beyond the second dielectric layer.

14. A method for metallizing an integrated circuit flip chip having at least two aluminum metallizations exposed at a surface thereof, the method comprising the steps of:

depositing a first photodefinable resin containing a catalytic filler on the surface of the integrated circuit flip chip and over the at least two aluminum metallizations so as to form a first dielectric layer, the catalytic filler comprising metal oxide particles distributed within the first photodefinable resin, the metal oxide particles being convertible to form an electroless plating catalyst;

photoimaging and developing the first dielectric layer so as to expose a portion of each of the at least two aluminum metallizations;

depositing a second photodefinable resin on the first dielectric layer and over the portions of each of the at least two aluminum metallizations so as to form a second dielectric layer;

photoimaging and developing the second dielectric layer so as to re-expose the portions of the at least two aluminum metallizations and a surface portion of the first dielectric layer that is contiguous with the portions of the at least two aluminum metallizations;

forming a catalytic metal layer on the portions of the at least two aluminum metallizations, the forming step comprising the steps of depositing zinc at the surfaces of the portions of the at least two aluminum metallizations so as to form a zinc film thereon, and electrolessly depositing a nickel layer on the zinc film;

treating the surface portions of the first dielectric layer such that the metal oxide particles at the surface portions are converted to form a catalytic film that renders the surface portions plateable; and electrolessly plating copper on the surface portions of the first dielectric layer and the catalytic metal layer so as to form a conductor that is electrically interconnected with each of the at least two aluminum metallizations so as to electrically interconnect the at least two aluminum metallizations.

15. A method as recited in claim 14 wherein the forming step further comprises the step of depositing palladium upon the nickel layer so as to form a palladium surface thereon, such that the palladium surface is exposed.

16. A method as recited in claim 14 further comprising the steps of:

depositing a third photodefinable resin on the conductive material and the second dielectric layer; and photodefining the third photodefinable resin so as to form a third dielectric layer that exposes a portion of the conductive material.

17. A method as recited in claim 16 further comprising the step of using the third dielectric layer as a mask to deposit a solderable metal on the conductive material.

18. A method for metallizing an integrated circuit flip chip having aluminum metallization exposed at a surface thereof, the method comprising the steps of:

depositing a first photodefinable resin containing a catalytic filler on the surface of the integrated circuit flip chip and over the aluminum metallization so as to form a first dielectric layer, the catalytic filler comprising metal oxide particles distributed within the first photodefinable resin, the metal oxide particles being convertible to form an electroless plating catalyst;

photoimaging and developing the first dielectric layer such that a first portion of the first dielectric layer remains on a peripheral portion of the aluminum metallization, a second portion of the first dielectric layer remains on an interior portion of the aluminum metallization, and an intermediate portion of the aluminum metallization remains between the interior and peripheral portions exposed;

depositing a second photodefinable resin on the first dielectric layer and over the intermediate portion of the aluminum metallization so as to form a second dielectric layer;

photoimaging and developing the second dielectric layer so as to re-expose the intermediate portion of the aluminum metallization and at least a portion of the first portion of the first dielectric layer;

depositing a third dielectric layer containing the catalytic filler on the second portion of the first dielectric layer;

depositing a catalytic metal on the intermediate portion of the aluminum metallization so as to form a catalytic metal layer thereon, the catalytic metal being less active than aluminum;

treating the first and third dielectric layers such that the catalytic filler renders the third dielectric layer and the first and second portions of the first dielectric layer plateable; and electrolessly plating a conductive material on the first and second portions of the first dielectric layer, the third dielectric layer, and the metal layer so as to form a continuous conductor that is electrically interconnected with the aluminum metallization.

19. A method as recited in claim 18 wherein the step of forming the third dielectric layer is performed such that the conductive material deposited on the third dielectric layer projects from the surface of the integrated circuit flip chip beyond the second dielectric layer.

* * * * *